US008730682B2

(12) United States Patent
Sato et al.

(10) Patent No.: US 8,730,682 B2
(45) Date of Patent: May 20, 2014

(54) ELECTRONIC APPARATUS ON WHICH PLUG-IN UNIT CAN BE MOUNTED

(75) Inventors: Yoshiyuki Sato, Kawasaki (JP); Tsutomu Takahashi, Kawasaki (JP); Kazuya Fuke, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 248 days.

(21) Appl. No.: 13/277,219

(22) Filed: Oct. 20, 2011

(65) Prior Publication Data

US 2012/0108093 A1 May 3, 2012

(30) Foreign Application Priority Data

Nov. 2, 2010 (JP) ................................ 2010-246892

(51) Int. Cl.
*H05K 5/00* (2006.01)

(52) U.S. Cl.
USPC ........... 361/754; 361/798; 361/755; 361/801; 361/760; 439/160; 439/157

(58) Field of Classification Search
CPC ........................ H01R 13/62988; H05K 7/1409
USPC ................. 361/798, 754, 801, 785, 760, 755; 439/160, 157
See application file for complete search history.

(56) References Cited

U.S. PATENT DOCUMENTS

| | | | | |
|---|---|---|---|---|
| 5,140,501 A | | 8/1992 | Takahashi et al. | |
| 5,309,325 A | * | 5/1994 | Dreher et al. | 361/754 |
| 5,317,480 A | * | 5/1994 | Chandraiah et al. | 361/785 |
| 5,364,282 A | * | 11/1994 | Tondreault | 439/157 |
| 6,494,729 B1 | * | 12/2002 | Stathopoulos et al. | 439/160 |
| 6,629,855 B1 | * | 10/2003 | North et al. | 439/325 |
| 7,070,431 B1 | * | 7/2006 | White | 439/160 |
| 7,438,577 B2 | * | 10/2008 | Bridges et al. | 439/260 |
| 2004/0001304 A1 | | 1/2004 | Katagiri et al. | |
| 2004/0192095 A1 | * | 9/2004 | Joist | 439/188 |
| 2005/0014403 A1 | | 1/2005 | Joist | |
| 2006/0003618 A1 | * | 1/2006 | Leidy | 439/160 |
| 2006/0012965 A1 | * | 1/2006 | Beall et al. | 361/726 |
| 2010/0265679 A1 | * | 10/2010 | Van Der Mee et al. | 361/759 |

FOREIGN PATENT DOCUMENTS

| | | |
|---|---|---|
| JP | 11-54966 A | 2/1999 |
| JP | 2004-031806 | 1/2004 |
| JP | 2005-045244 | 2/2005 |
| WO | WO-89/10681 | 11/1989 |

* cited by examiner

*Primary Examiner* — Timothy Thompson
*Assistant Examiner* — Steven T Sawyer
(74) *Attorney, Agent, or Firm* — Fujitsu Patent Center

(57) ABSTRACT

An electronic apparatus including a housing that includes a first connector, and a printed circuit board unit that includes a printed circuit board, a second connector that is connected to the first connector at the completion of insertion of the printed circuit board into the housing, a lever that is rotatably provided for the printed circuit board, and a lock mechanism that locks the lever in a predetermined position. Wherein when the printed circuit board is inserted into the housing, the lever in a first position comes into contact with the housing, when the printed circuit board is further inserted into the housing, the lever rotates in one direction while being in contact with the housing, and when the insertion of the printed circuit board into the housing is completed, the lever is in a second position, and the lock mechanism locks the lever in the second position.

2 Claims, 22 Drawing Sheets

ELECTRONIC APPARATUS ON WHICH PLUG-IN UNIT CAN BE MOUNTED

CROSS-REFERENCE TO RELATED APPLICATION(S)

This application is based upon and claims the benefit of priority of the prior Japanese Patent Application No. 2010-246892, filed on Nov. 2, 2010, the entire contents of which are incorporated herein by reference.

FIELD

The embodiments discussed herein are related to an electronic apparatus on which plug-in unit can be mounted.

BACKGROUND

An electronic apparatus including a housing which a printed circuit board unit can be inserted into or removed from has been known. Examples of related art are disclosed in International Publication No. WO 89/10681 and Japanese Laid-open Patent Publication No. 11-54966.

SUMMARY

According to an aspect of the invention, an electronic apparatus including: a housing including a first connector; and a printed circuit board unit including a printed circuit board, a second connector that is connected to the first connector at the completion of insertion of the printed circuit board into the housing, a lever that is rotatably provided for the printed circuit board, and a lock mechanism that locks the lever in a predetermined position, wherein when the printed circuit board is inserted into the housing, the lever in a first position comes into contact with the housing, when the printed circuit board is further inserted into the housing, the lever rotates in one direction while being in contact with the housing, and when the insertion of the printed circuit board into the housing is completed, the lever is in a second position, and the lock mechanism locks the lever in the second position.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A printed circuit board unit (hereinafter, referred to as a "plug-in unit (PIU)") and a housing are provided with connectors connectable to each other. The connectors are connected to each other when the PIU is inserted into the housing. If the PIU is forcibly inserted into the housing, impact may be applied to the PIU and the housing. A large impact may cause chattering or deformation of terminals of the connectors.

First Embodiment

Figure 1A:
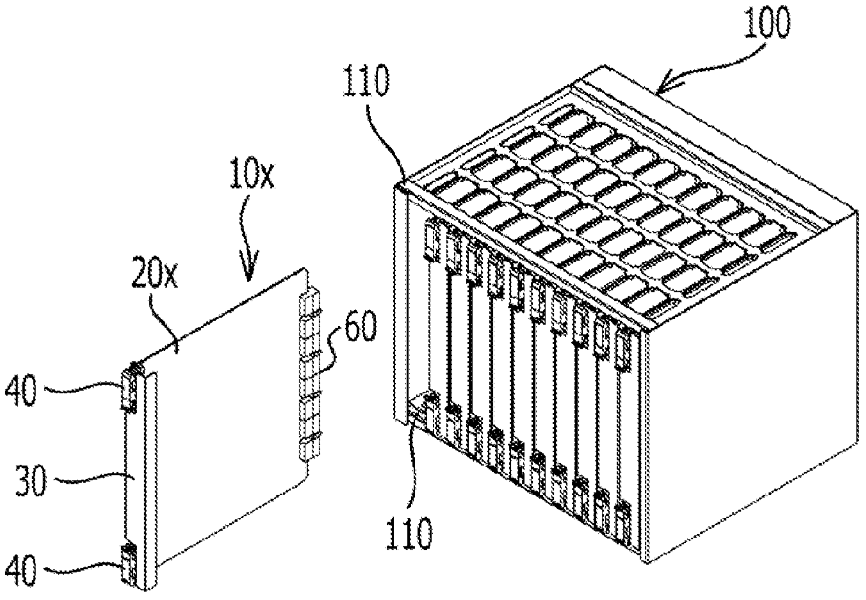
FIGS. 1A and 1B are diagrams explaining electronic apparatuses different from an electronic apparatus according to a first embodiment.
Figure 1B:
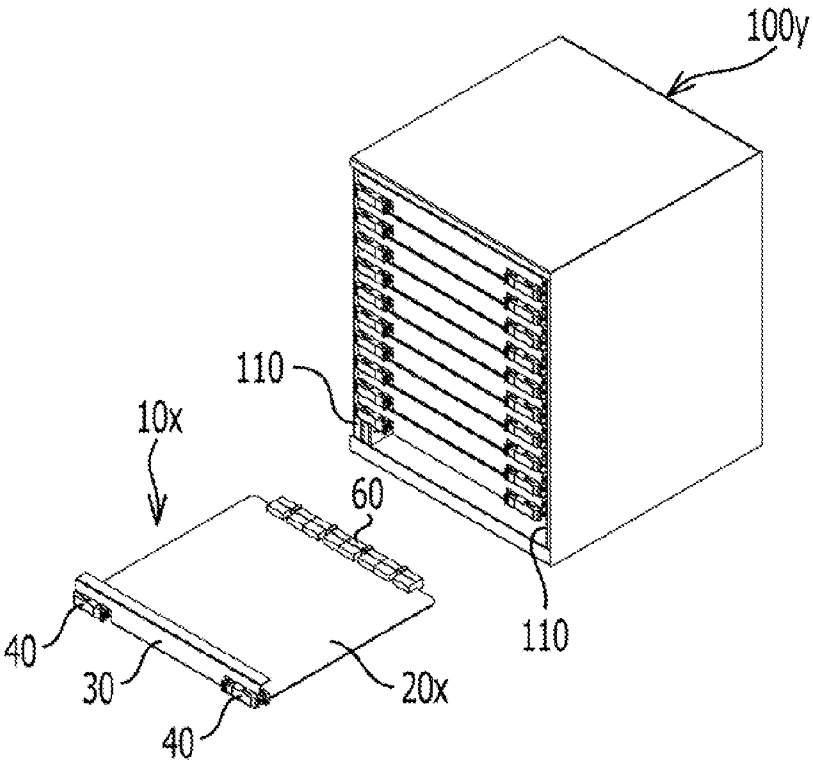

Prior to description of an electronic apparatus according to a first embodiment, electronic apparatuses different from the electronic apparatus according to the first embodiment will be described. FIGS. 1A and 1B are diagrams explaining the electronic apparatuses different from that according to the first embodiment. The electronic apparatus illustrated in FIG. 1A includes a plurality of PIUs 10*x* and a housing 100 into which the PIUs 10*x* can be inserted. Each PIU 10*x* includes a printed circuit board 20*x*, a cover 30 fixed to the printed circuit board 20*x*, two levers 40 provided for the printed circuit board 20*x*, and a connector 60 attached to the printed circuit board 20*x*. The housing 100 can receive the printed circuit board 20*x* in a vertical position such that flat surfaces of the printed circuit board 20*x* extend vertically. The housing 100 has an insertion opening and includes frames 110 arranged in upper and lower portions of the insertion opening such that the frames extend horizontally. Each lever 40 is rotatable in a predetermined range relative to the printed circuit board 20*x*. The housing 100 further has a plurality of grooves guiding insertion of the PIUs 10*x*.

The electronic apparatus illustrated in FIG. 1B includes a housing 100*y* and a plurality of PIUs 10*x*. The housing 100*y* can receive the printed circuit board 20*x* in a horizontal position such that the flat surfaces of the printed circuit board 20*x* extend horizontally. The electronic apparatus in FIG. 1A will be described below.

Figure 2:
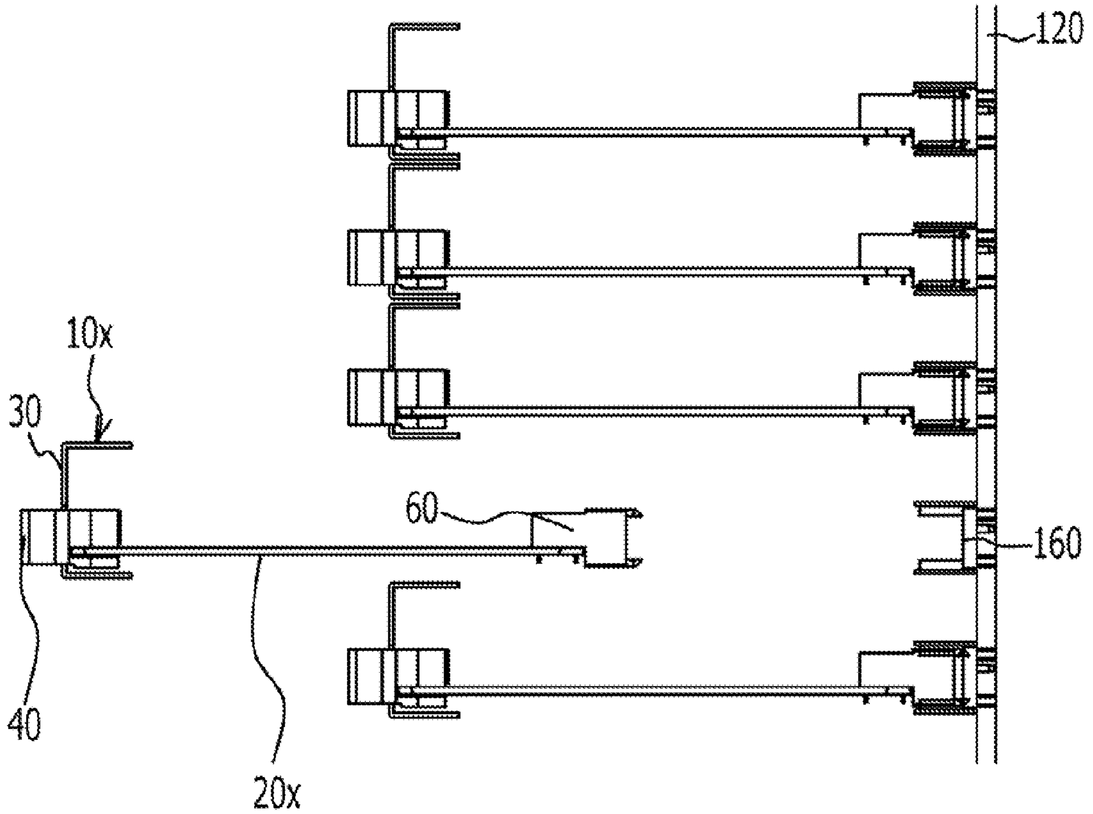
FIG. 2 is a diagram illustrating a state within a housing.

FIG. 2 illustrates a state within the housing 100. The housing 100 includes a backplane 120 disposed therein. The backplane 120 is a rigid printed circuit board. The backplane 120 is provided with a plurality of connectors 160. When the PIU 10*x* is inserted into the housing 100, the connector 60 engages with the connector 160. Thus, the printed circuit board 20*x* is electrically connected to the backplane 120.

FIGS. 3A to 3D are diagrams explaining a normal procedure for inserting the PIU 10*x* to the housing 100. FIGS. 3A to 3D each illustrate a state of the lever 40, that of the connector 60, and that of the connector 160. The lever 40 is provided for the printed circuit board 20*x* such that it is rotatable about a shaft 45, serving as a fulcrum. The lever 40 has two pawls 42 and 44 arranged in one end. The front end of the frame 110 provided for the housing 100 is U-shaped when viewed from the side.

Figure 3A:
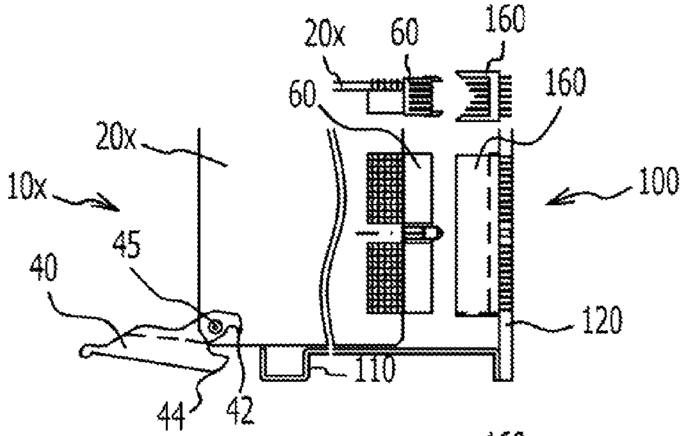
FIGS. 3A to 3D are diagrams explaining a normal procedure for inserting a PIU into the housing.
Figure 3B:
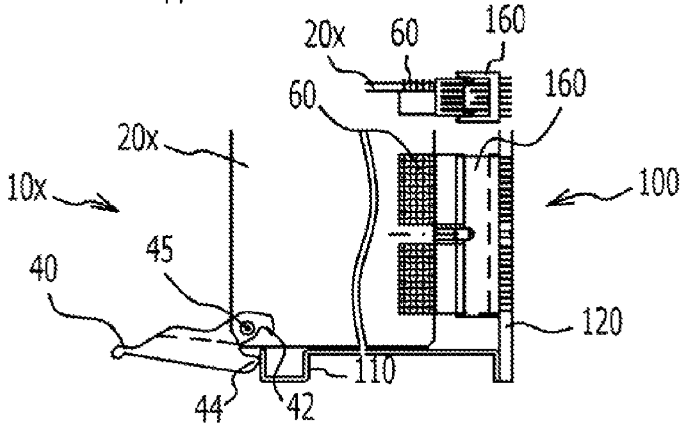
Figure 3C:
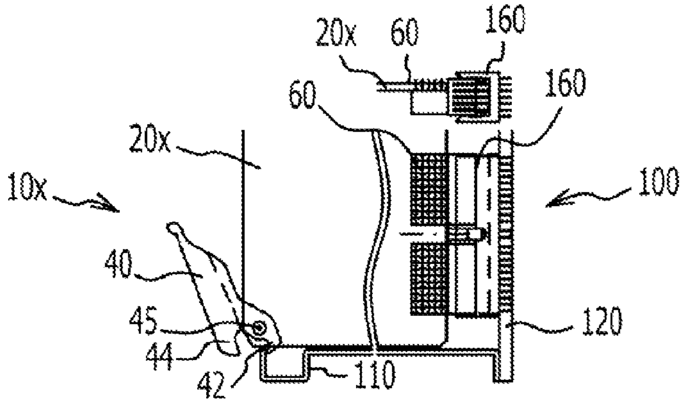
Figure 3D:
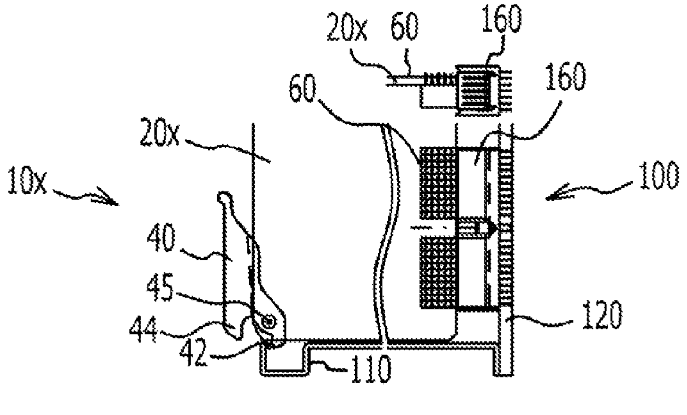

Referring to FIG. 3A, before the lever 40 comes into contact with the frame 110, the connector 60 does not engage with the connector 160. The lever 40 is in a lying position naturally as illustrated in FIG. 3A. Referring to FIG. 3B, when the PIU 10*x* is inserted into the housing 100 such that the pawl 44 comes into contact with the frame 110, the connector 60 comes into contact with the connector 160. In such a state, when the lever 40 is rotated such that the lever 40 is moved to a standing position, the pawl 44 moves away from the frame 110 as illustrated in FIG. 3C and the pawl 42 comes into contact with the frame 110 to generate a force to push the frame 110 forward. Thus, the printed circuit board 20*x* moves to the back of the housing 100, so that the degree of engagement between the connectors 60 and 160 increases. When the lever 40 is further rotated such that the lever 40 stands completely, the printed circuit board 20*x* moves up to the back of the housing 100 as illustrated in FIG. 3D, so that the connector 60 properly engages with the connector 160.

Figure 4A:
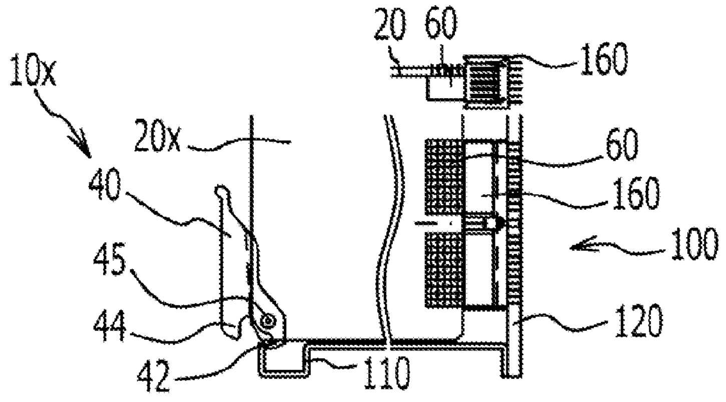
FIGS. 4A to 4C are diagrams explaining a normal procedure for removing the PIU from the housing.
Figure 4B:
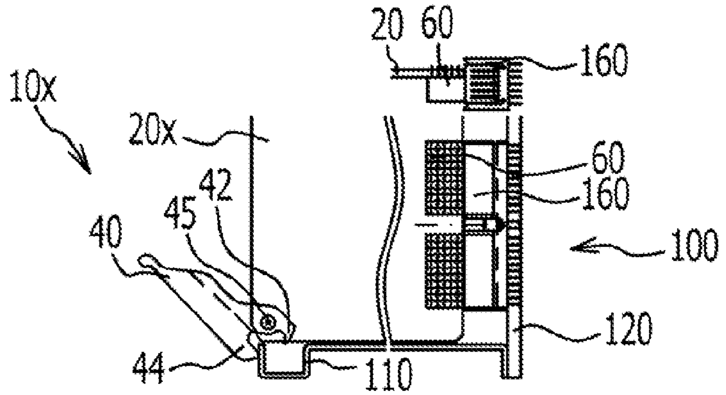
Figure 4C:
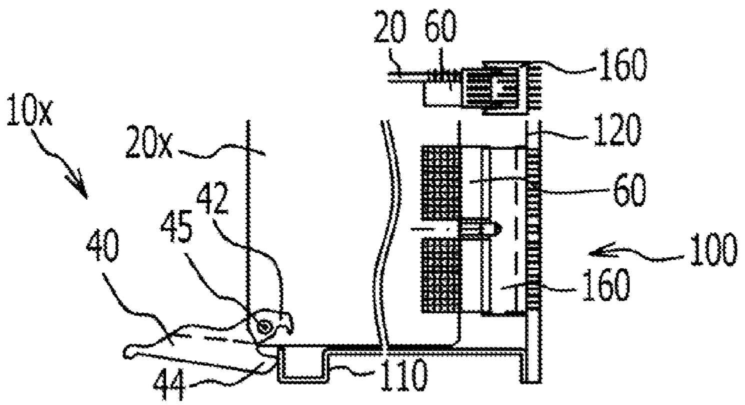

FIGS. 4A to 4C are diagrams explaining a normal procedure for removing the PIU 10*x* from the housing 100. FIG. 4A illustrates a state where the connector 60 properly engages with the connector 160. In this state, the lever 40 is rotated such that the lever 40 is moved to the lying position as illustrated in FIG. 4B. Consequently, the pawl 44 of the lever 40 pushes the frame 110. When the lever 40 is further rotated, the printed circuit board 20*x* moves forward and the connector 60 disengages from the connector 160, so that the PIU 10*x* is removed from the housing 100. The lever 40 assists in the insertion and removal of the PIU 10*x* into/from the housing 100.

Figure 5A:
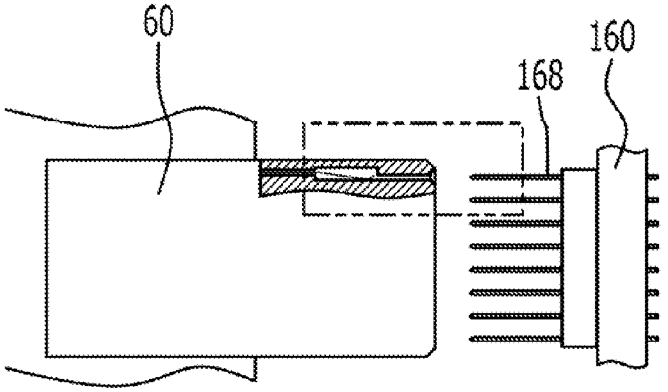
FIGS. 5A to 5C are diagrams explaining connectors.
Figure 5B:
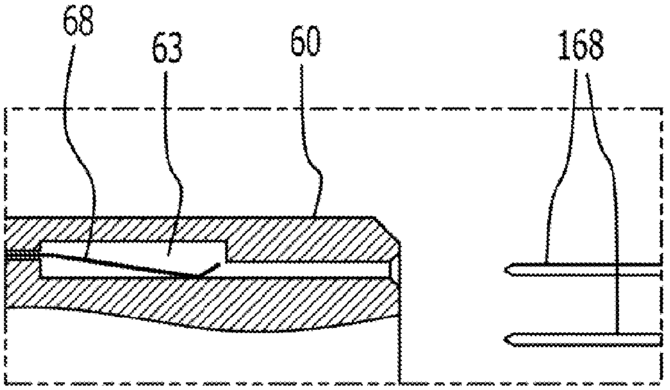
Figure 5C:
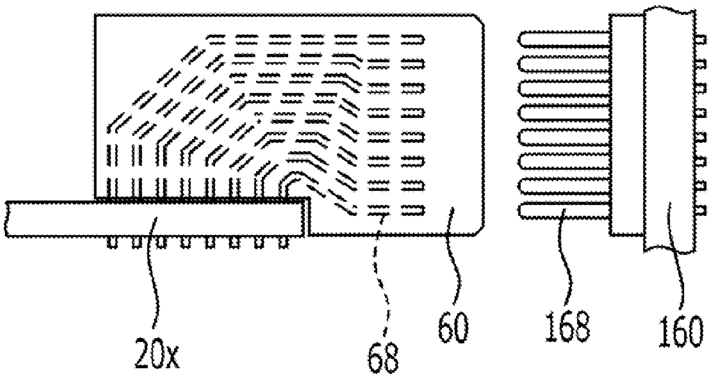

The connectors will now be described. FIGS. 5A and 5B are diagrams explaining the connectors. FIG. 5A illustrates the connectors 60 and 160 when viewed from the side. FIG. 5B is an enlarged view of part of FIG. 5A. FIG. 5C illustrates the connectors 60 and 160 when viewed from the above. The connector 60 has a plurality of insertion holes 63 and terminals 68 received in the insertion holes 63. The connector 160 has a plurality of terminals 168 such that the terminals 168 correspond to the respective terminals 68. Each terminal 68 presses against the inner wall of the insertion hole 63. The terminal 68 is plate-spring-shaped.

Figure 6A:
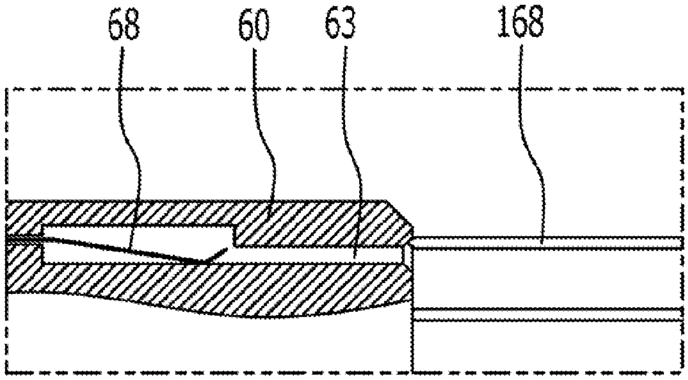
FIGS. 6A to 6C are diagrams explaining connection of the connectors.
Figure 6B:
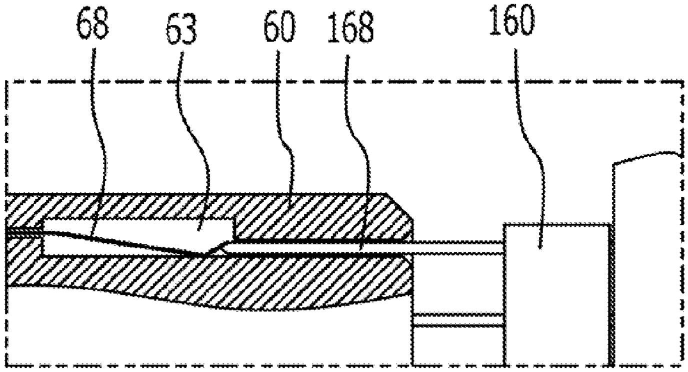
Figure 6C:
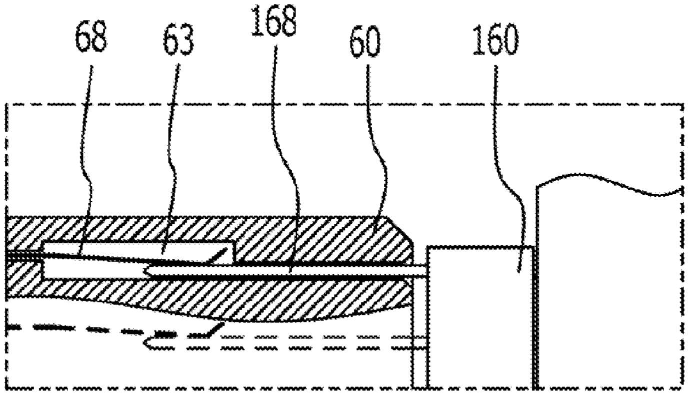

FIGS. 6A to 6C are diagrams explaining connection of the connectors. Each terminal 168 is inserted into the corresponding insertion hole 63 such that the terminal 168 is disposed between the inner wall, which the terminal 68 presses against, of the insertion hole 63 and the terminal 68. An elastic restoring force of the terminal 68 allows the terminal 68 to press against the terminal 168. Thus, the connection of the terminals 68 and 168 is ensured.

Figure 7A:
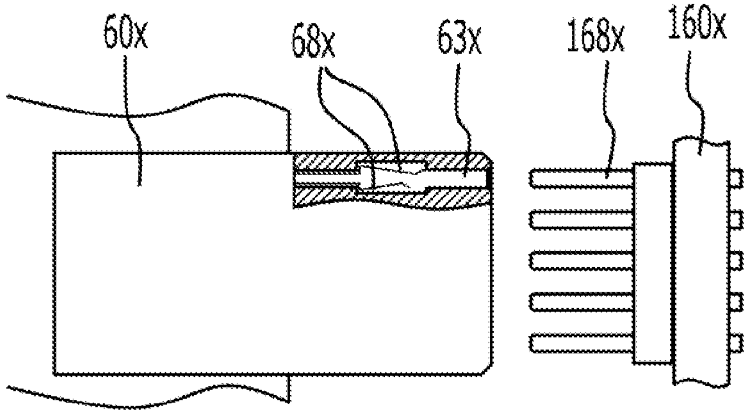
FIGS. 7A and 7B are diagrams illustrating examples of the connectors.
Figure 7B:
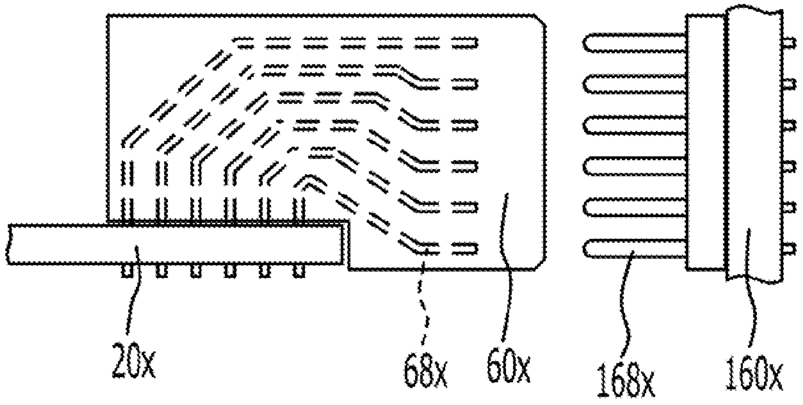

FIGS. 7A and 7B illustrate examples of the connectors. Referring to FIG. 7A, the diameter of each terminal 168*x* of a connector 160*x* is larger than that of each terminal 168. The number of terminals 168*x* is less than that of terminals 168. The diameter of an insertion hole 63*x* is larger than that of the insertion hole 63. Two terminals 68*x* are arranged in each insertion hole 63. The two terminals 68*x* are arranged so as to sandwich the terminal 168*x*. Like the terminal 68 illustrated in FIG. 6A, each terminal 68 is thin and plate-spring-shaped, such that it is elastically deformable. In FIG. 7A, the cross-section of the connector 60*x* is partly illustrated.

As described above, the terminals 68 of the connector 60 and the terminals 168 of the connector 160 in FIGS. 5A to 5C are arranged at a higher density than the terminals 68*x* of the connector 60*x* and the terminals 168*x* of the connector 160*x*. Recently, the above-described high-density arrangement of terminals has been desired. Inevitably, the occupied area of each terminal tends to be reduced. As will be described in detail later, therefore, there is a high possibility that the terminals 168 arranged at a high density will plastically deform.

Figure 8A:
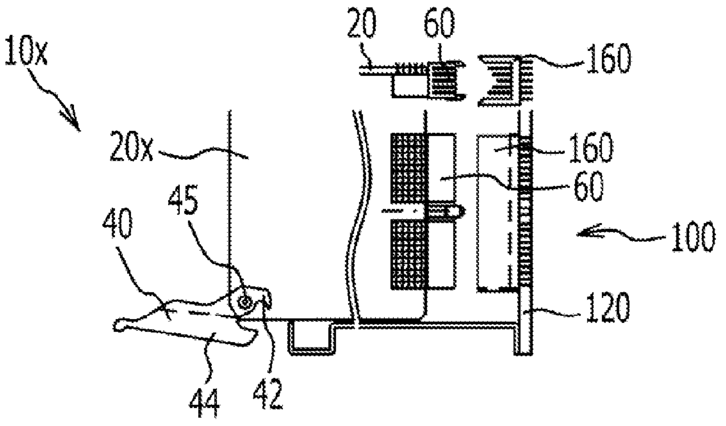
FIGS. 8A to 8D are diagrams explaining insertion of the PIU into the housing without the use of a lever.
Figure 8B:
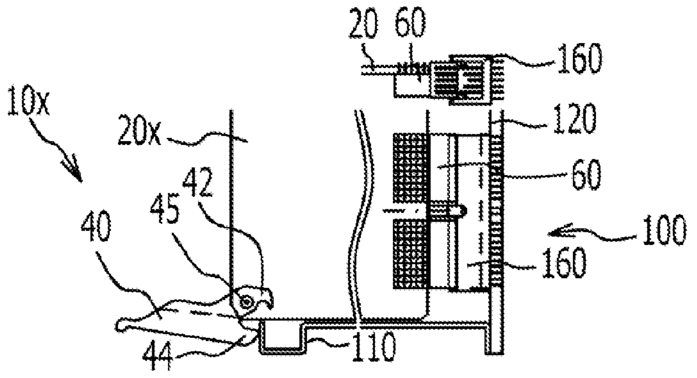
Figure 8C:
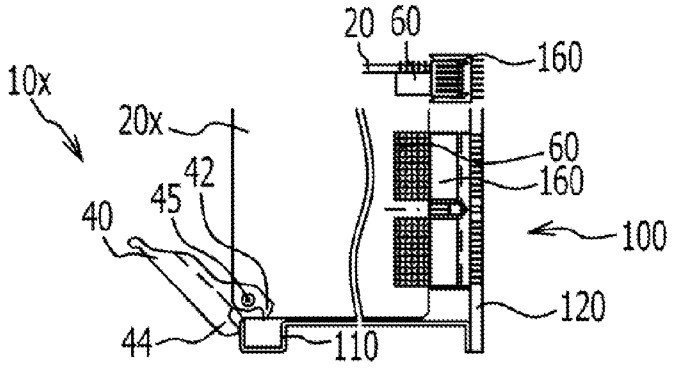
Figure 8D:
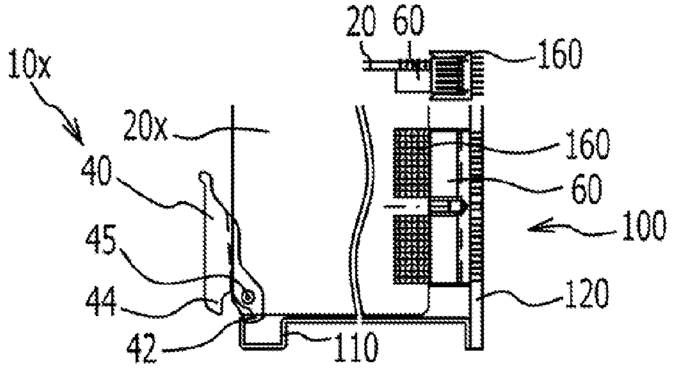

FIGS. 8A to 8D are diagrams illustrating insertion of the PIU 10*x* into the housing 100 without the use of the lever 40. It is assumed that the PIU 10*i* is forcibly inserted into the housing 100. When the PIU 10*x* is forcibly inserted into the housing 100 while the lever 40 is not in contact with the frame 110 as illustrated in FIG. 8A, the pawl 44 of the lever 40 comes into contact with the frame 110 as illustrated in FIG. 8B. Since momentum is given to the PIU 10*x*, the lever 40 rotates while the pawl 44 is in contact with the frame 110 as illustrated in FIG. 8C. At this time, the connector 60 engages with the connector 160. When being manually rotated, the lever 40 is moved to the standing position as illustrated in FIG. 8D.

If the PIU 10*x* is inserted into the housing 100 without the use of the lever 40 as described above, the PIU 10*x* can be forcibly inserted into the housing 100. In this way of insertion, impact is applied to the PIU 10*x* and the housing 100. Consequently, for example, chattering may occur between the terminals 68 of the connector 60 of another PIU 10*x*, which has already been fitted in the housing 100, and the terminals 168 of the corresponding connector 160. In addition, a load is applied to the printed circuit board 20*x* and the backplane 120.

Figure 9A:
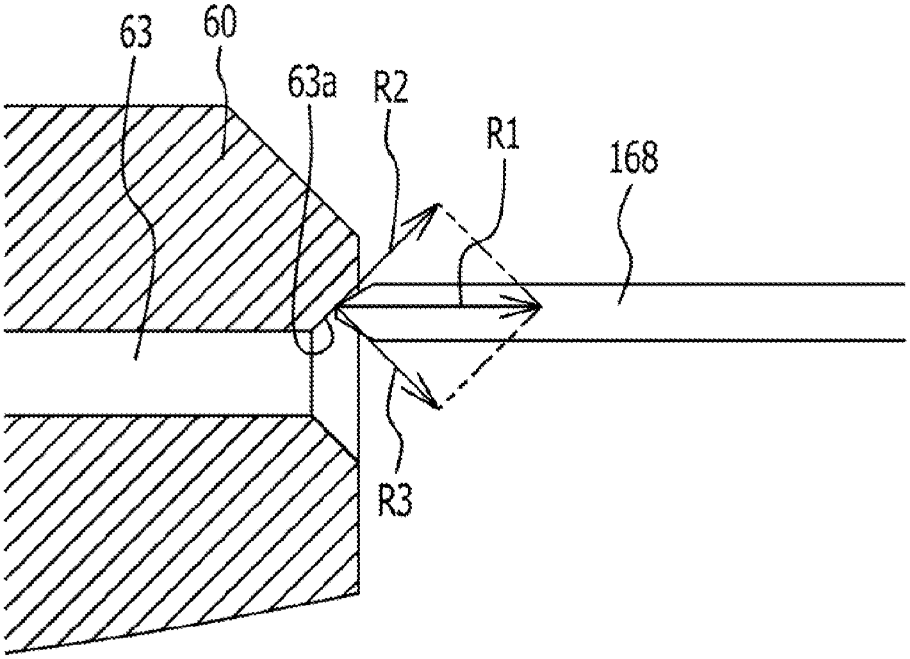
FIGS. 9A and 9B are diagrams explaining a problem that may occur in the connectors.
Figure 9B:
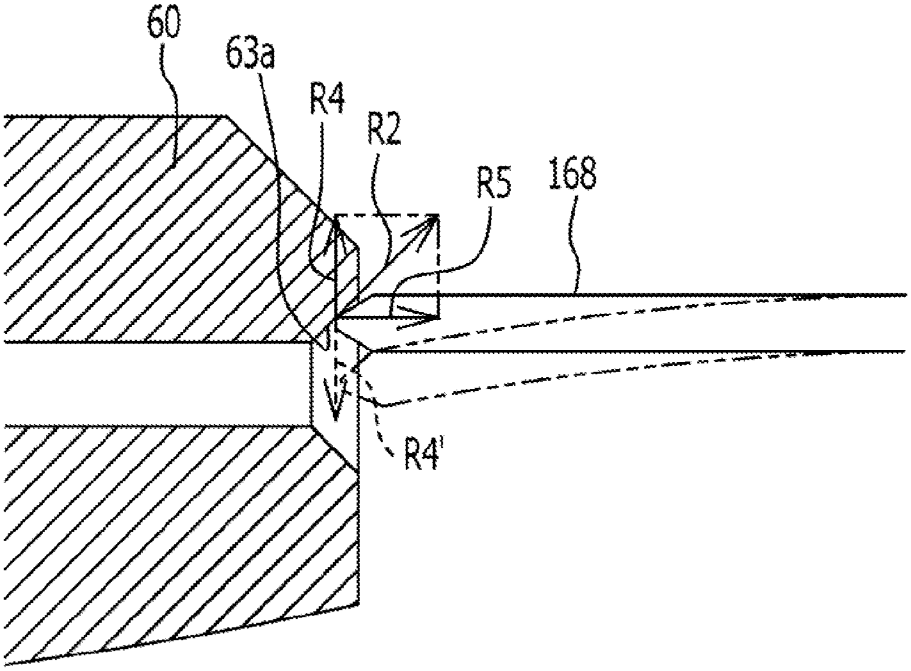

Furthermore, the connector 160 may have the following problem. FIGS. 9A and 9B are diagrams explaining the problem that may occur in the connectors. FIG. 9A is an enlarged view of essential part when the connector 60 is moved such that the terminals 168 are inserted into the insertion holes 63. The edge of each insertion hole 63 has a tapered face 63*a* for guiding the insertion of the terminal 168. Upon insertion of the PIU 10*x* into the housing 100, the terminal 168 may come into contact with the tapered face 63*a* of the connector 60. If the tapered face 63*a* comes into contact with the terminal 168, a force R1 acting in the axial direction of the terminal 168 is applied to the terminal 168. The force R1 can be resolved into a component R2 acting parallel to the tapered face 63*a* and a component R3 acting perpendicular to the tapered face 63*a*. The component R3 does not affect movement of the connector 60.

Referring to FIG. 9B, the component R2 can be resolved into a subcomponent R4 acting perpendicular to the axial direction of the terminal 168 and a subcomponent R5 acting parallel to the axial direction of the terminal 168. The subcomponent R5 does not affect the movement of the connector

60. A reaction force R4' of the subcomponent R4 acts as a force deflecting the terminal 168. Accordingly, if the connector 60 is forcibly moved and each tapered face 63*a* comes into contact with the corresponding terminal 168, a large reaction force R4' acts on the terminal 168, so that the terminal 168 may plastically deform. In particular, in the recent high-density arrangement of terminals, the terminals have to be thinned. The terminals therefore tend to plastically deform. The plastic deformation of the terminals 168 may cause contact failure.

Figure 10:
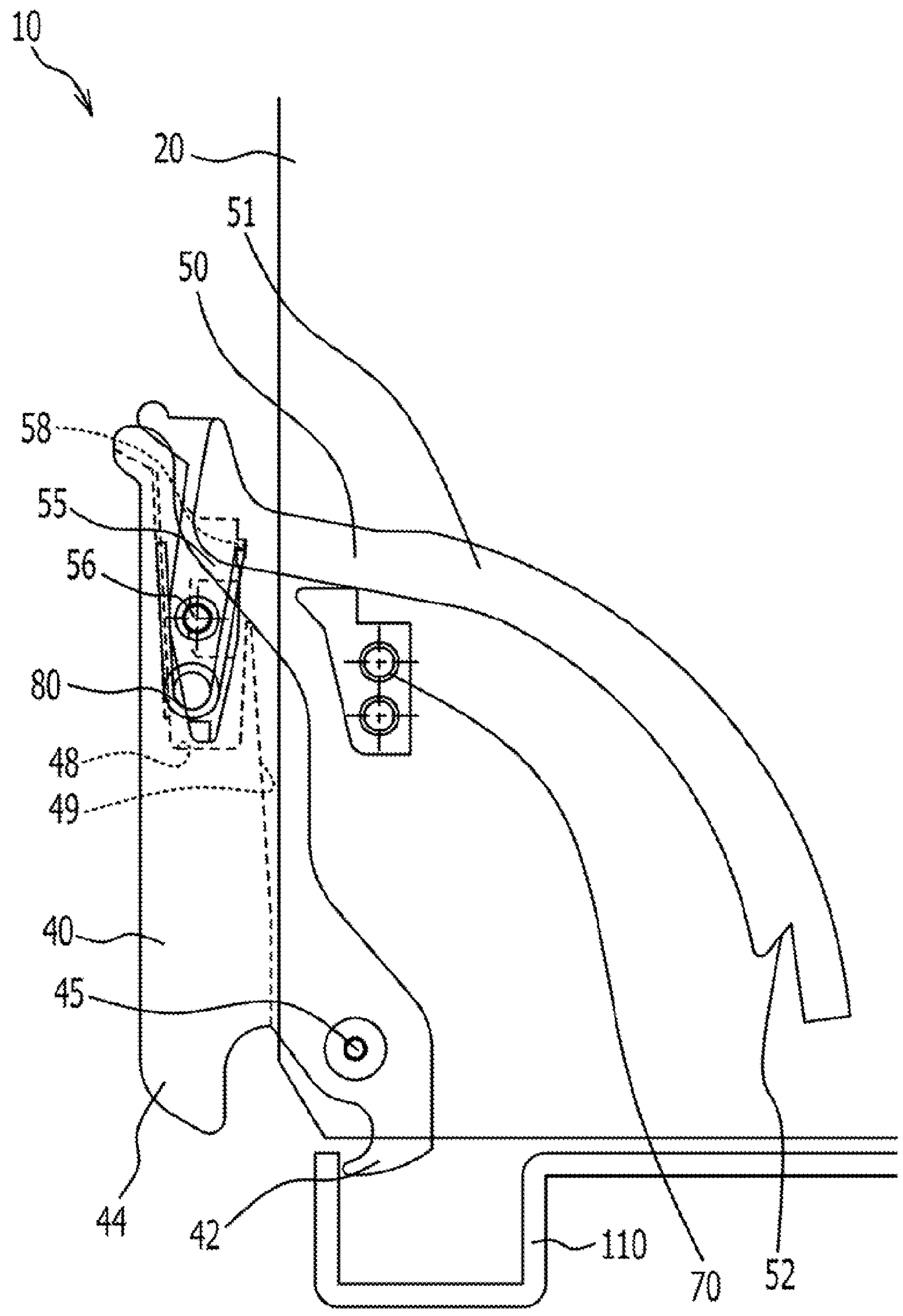
FIG. 10 is an enlarged view of part of a PIU included in the electronic apparatus according to the first embodiment.
Figure 11:
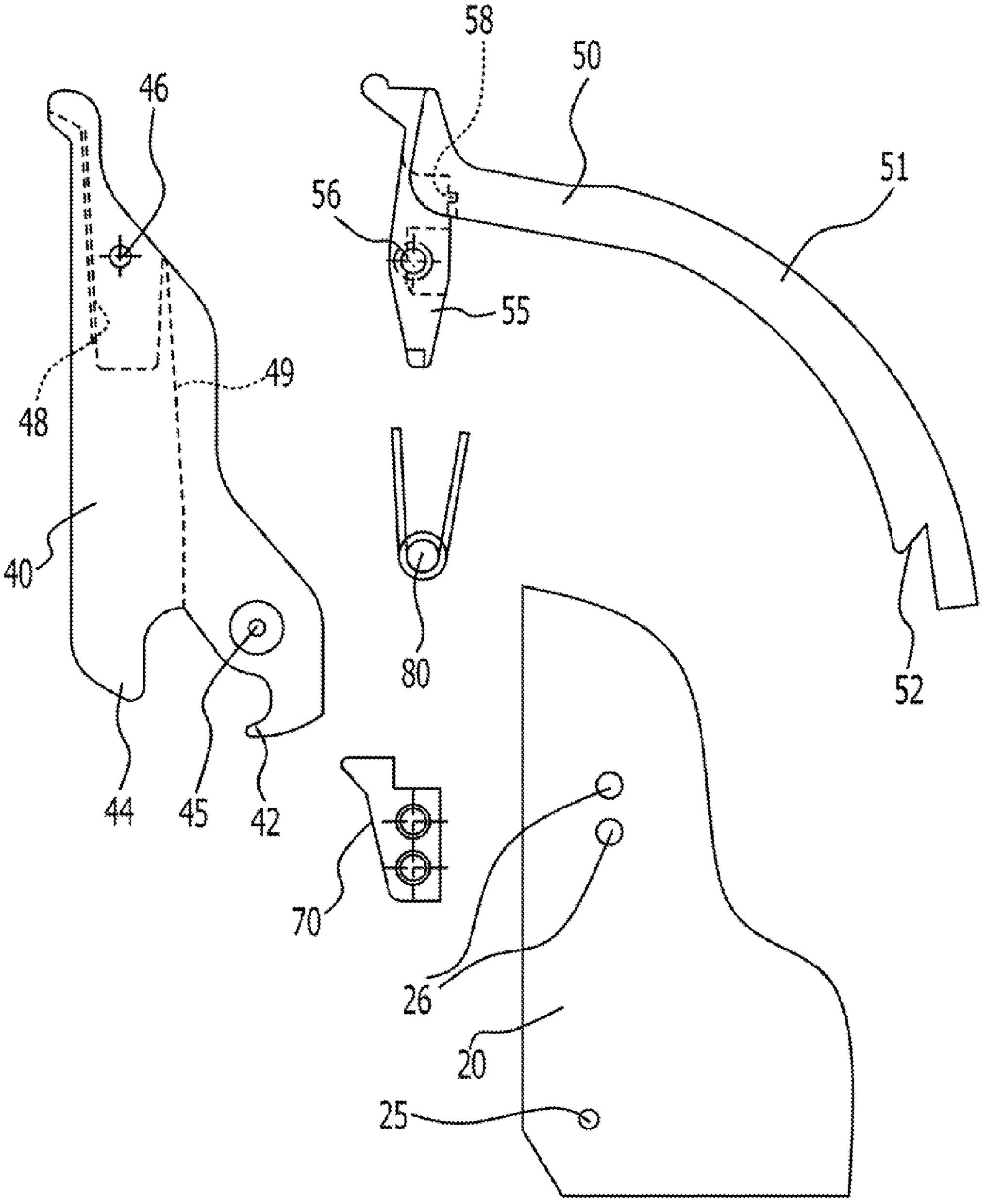
FIG. 11 is a diagram illustrating parts of the PIU included in the electronic apparatus according to the first embodiment.

FIG. 10 is an enlarged view of part of a PIU 10 included in the electronic apparatus according to the first embodiment. FIG. 11 illustrates parts of the PIU 10 included in the electronic apparatus according to the first embodiment. FIG. 10 illustrates a state in which a lever 40 is in the standing position. The lever 40 is coupled to a lock lever 50. Specifically, the lever 40 has an opening 46 and the lock lever 50 includes a shaft 56 rotatably fitted in the opening 46. An urging member 80 is disposed between the lever 40 and the lock lever 50. The urging member 80 is, for example, a metal spring. The urging member 80 is held in a recess 48 of the lever 40. One end of the urging member 80 presses against the lever 40 and the other end thereof presses against a pressure receiving portion 58 of the lock lever 50. Referring to FIG. 10, the urging member 80 urges the lock lever 50 clockwise relative to the lever 40.

The lock lever 50 includes an operating portion 51 which extends along an arc and a fastening portion 55 which is continuous with the base end of the operating portion 51. The operating portion 51 includes an engaging portion 52 in its free end. The fastening portion 55 is provided with the shaft 56. The fastening portion 55 is received in the recess 48 of the lever 40. Since the fastening portion 55 is received in the recess 48, the fastening portion 55 can rotate on the shaft 56, serving as a fulcrum, in a predetermined range. The lever 40 has a clearance 49 to prevent interference with a printed circuit board 20 while the lever 40 is in the standing position. A regulating portion 70 is fixed to the printed circuit board 20. Referring to FIG. 11, the printed circuit board 20 has two openings 26 for fixing the regulating portion 70. The printed circuit board 20 further has an opening 25 in which the shaft 45 of the lever 40 is rotatably fitted.

A procedure for inserting the PIU 10 into the housing 100 in this embodiment will now be described. FIGS. 12A to 12D are diagrams explaining the procedure for inserting the PIU 10 into the housing 100 in the electronic apparatus according to the first embodiment. The electronic apparatus according to the first embodiment includes the above-described housing 100. In FIGS. 12A to 12D, some of the components are not designated by the reference numerals.

Figure 12A:
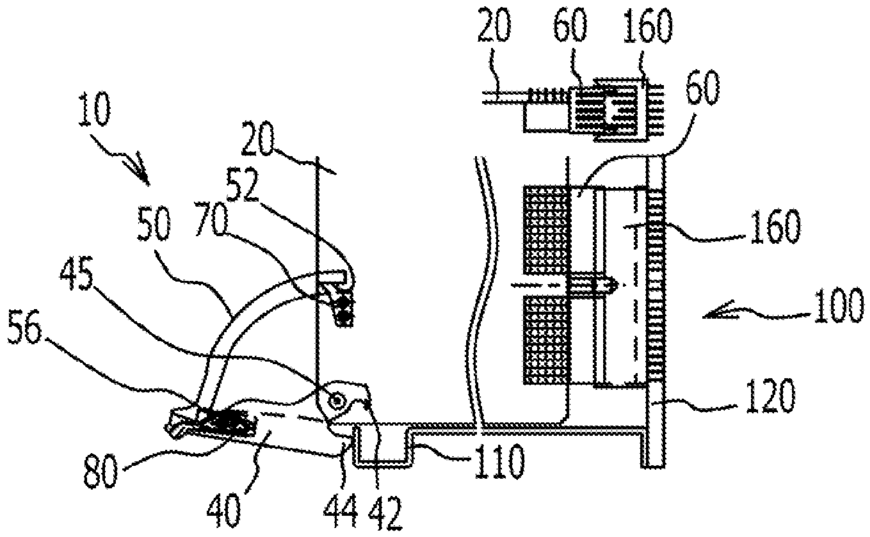
FIGS. 12A to 12D are diagrams explaining a procedure for inserting the PIU into the housing in the electronic apparatus according to the first embodiment.
Figure 12B:
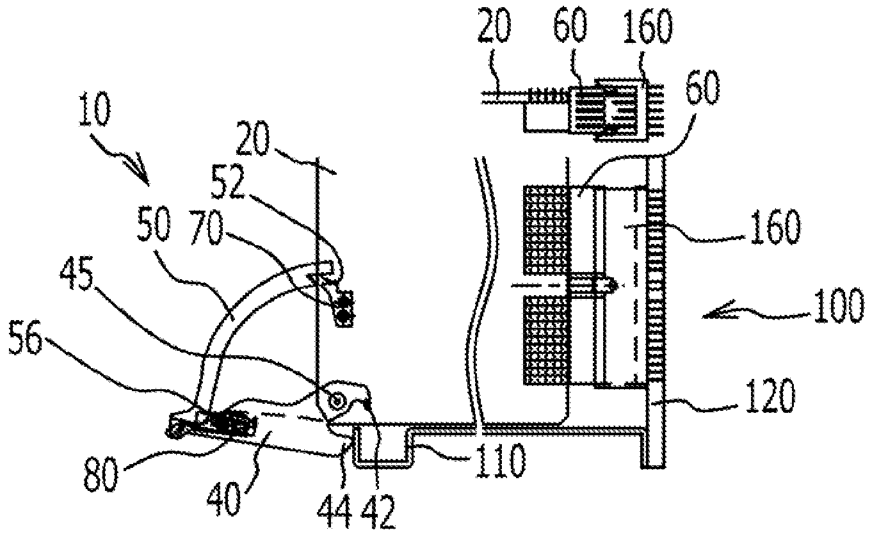
Figure 12C:
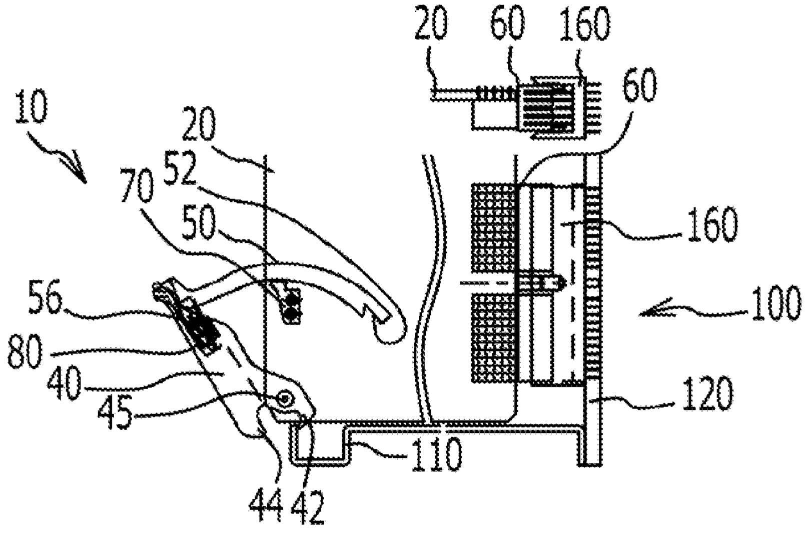
Figure 12D:
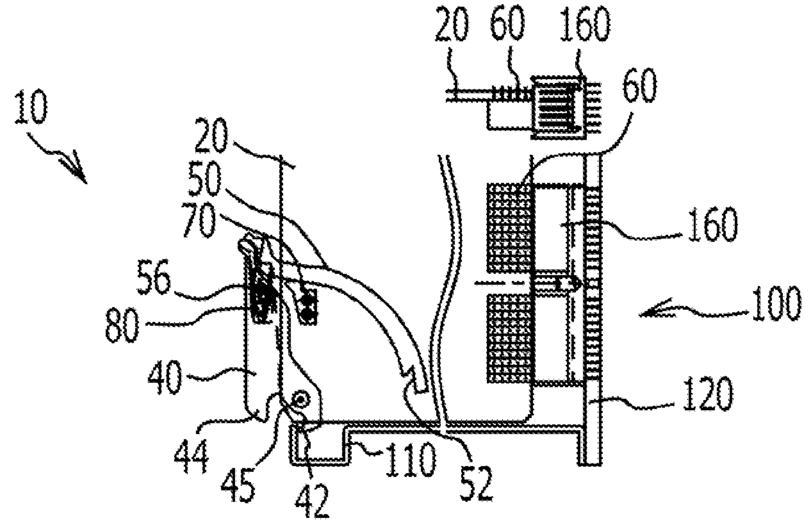

Referring to FIG. 12A, while the engaging portion 52 of the lock lever 50 is engaged with the regulating portion 70, the PIU 10 is inserted into the housing 100. Since the lock lever 50 is engaged with the regulating portion 70, the lever 40 is locked in the lying position. The posture of the lever 40 in the lying position will be called a first position. While the lever 40 is locked in the first position, the PIU 10 is prevented from moving to the back of the housing 100, because the pawl 44 of the lever 40 is in contact with the frame 110. To unlock such a locked state, an operator separates the engaging portion 52 of the lock lever 50 from the regulating portion 70 against an urging force of the urging member 80 as illustrated in FIG. 12B. Consequently, the lock lever 50 can move above the regulating portion 70 as illustrated in FIG. 12C. Accordingly, the lever 40 can move from the first position to the standing position. The posture of the lever 40 in the standing position will be called a second position. The movement of the lever 40 from the first position to the second position allows the PIU 10 to move to the back of the housing 100 as illustrated in FIG. 12D. Thus, the connector 60 properly engages with the connector 160.

As described above, while the lever 40 is locked in the first position by the lock lever 50 and the regulating portion 70, the insertion of the PIU 10 into the housing 100 is prevented. The operator therefore has to disengage the lock lever 50 from the regulating portion 70 in order to insert the PIU 10 into the housing 100. As described above, the PIU 10 is prevented from being forcibly inserted into the housing 100. Thus, the occurrence of the above-described problem can be prevented.

Second Embodiment

Figure 13A:
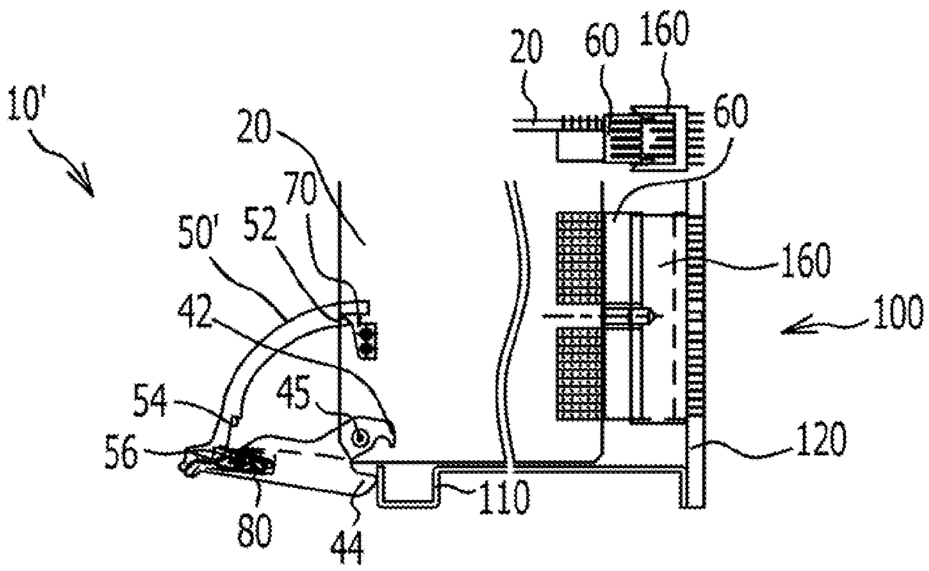
FIGS. 13A to 13D are diagrams explaining a procedure for inserting a PIU into the housing in an electronic apparatus according to a second embodiment.
Figure 13B:
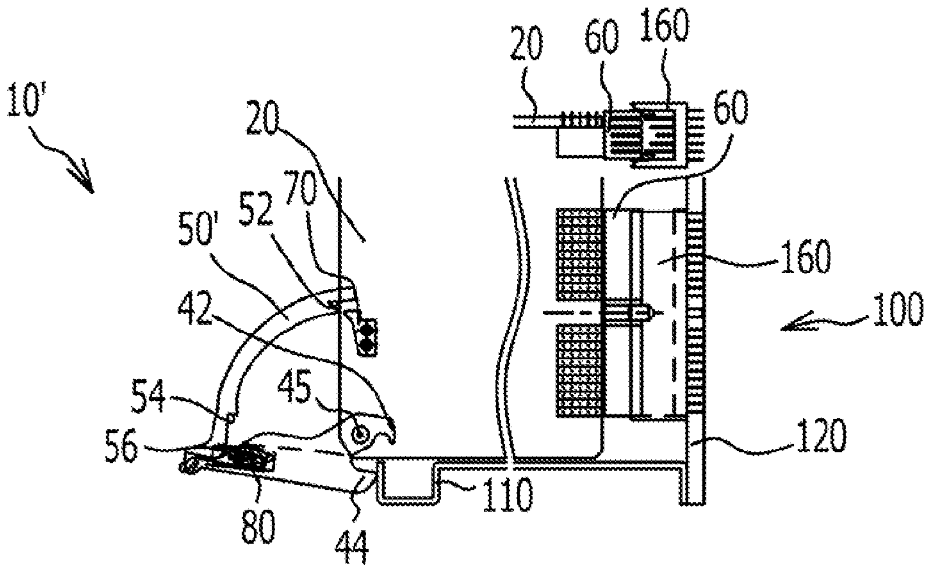
Figure 13C:
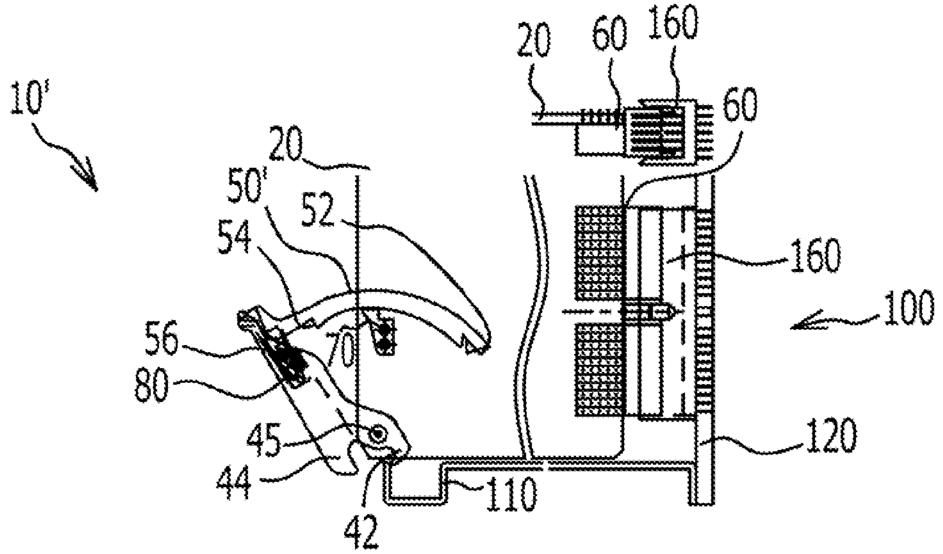
Figure 13D:
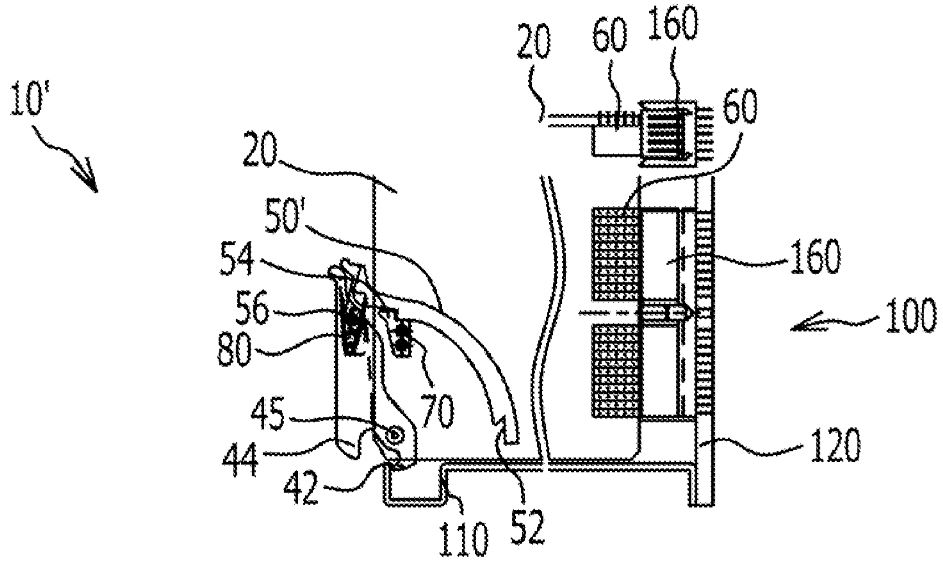

An electronic apparatus according to a second embodiment will be described. The same components as those of the electronic apparatus according to the first embodiment are designated by the same reference numerals and redundant explanation is omitted. FIGS. 13A to 13D are diagrams explaining a procedure for inserting a PIU 10' into the housing 100 in the electronic apparatus according to the second embodiment. The electronic apparatus according to the second embodiment includes the PIU 10'. The PIU 10' includes a lock lever 50'. The lock lever 50' includes the engaging portion 52 in one end and further includes an engaging portion 54 in the other end. The engaging portion 54 engages with the regulating portion 70 as illustrated in FIG. 13D while the lever 40 is in the second position. Thus, the lever 40 is locked in the first position and is also locked in the second position by the regulating portion 70. To unlock such a locked state, the operator has to disengage the engaging portion 54 of the lock lever 50' from the regulating portion 70 and move the lever 40 from the second position to the first position. Thus, while the PIU 10' is properly fitted in the housing 100, the PIU 10' is prevented from being removed from the housing 100 by accidental operation of the lever 40. Moreover, since the lever 40 is locked in the second position, the PIU 10' is prevented from being removed from the housing 100 if vibration is applied such that the PIU 10' moves in a direction in which the PIU 10' is removed from the housing 100. As described above, the lock lever 50' prevents the PIU 10' from being removed from the housing 100 by accidental operation of the lever 40.

Third Embodiment

Figure 14A:
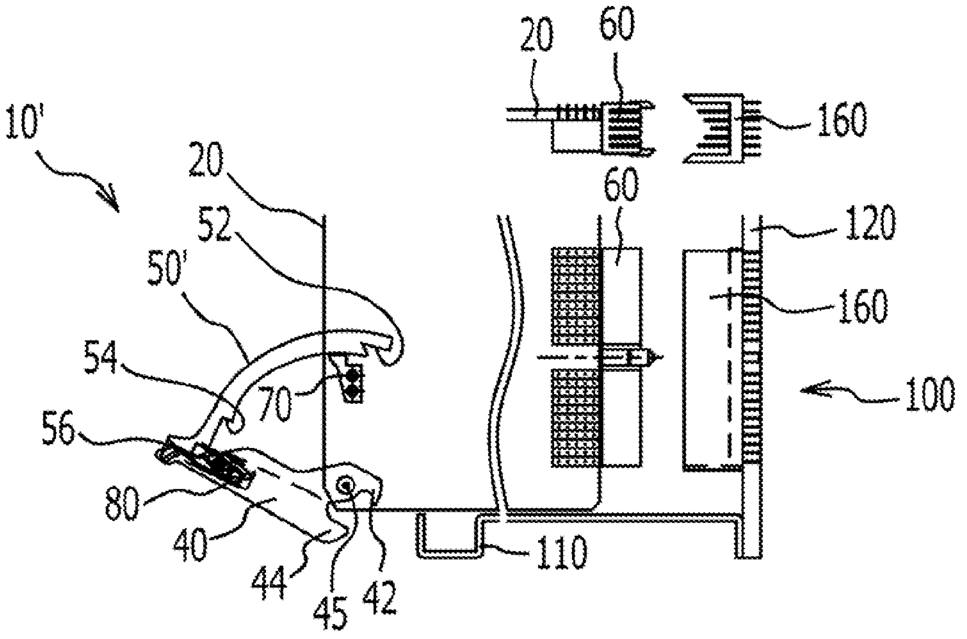
FIGS. 14A and 14B are diagrams explaining the electronic apparatus according to the second embodiment.
Figure 14B:
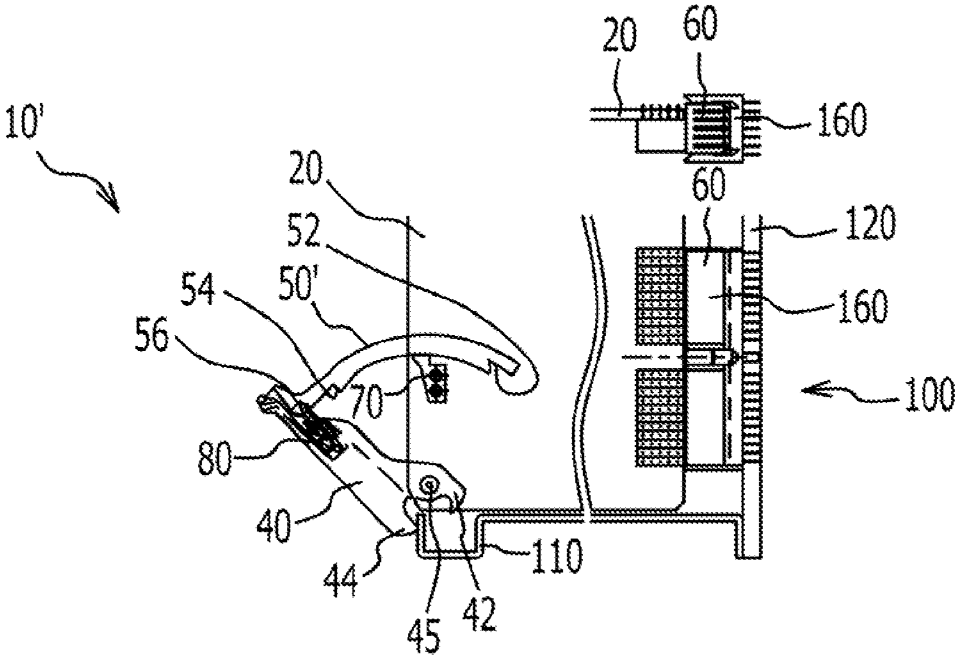

The electronic apparatus according to the second embodiment will be further described prior to description of an electronic apparatus according to a third embodiment. FIGS. 14A and 14B are diagrams explaining the electronic apparatus according to the second embodiment. If the PIU 10' is inserted into the housing 100 while the lock lever 50' is not engaged with the regulating portion 70 as illustrated in FIG. 14A, the pawl 44 of the lever 40 comes into contact with the frame 110 as illustrated in FIG. 14B and the PIU 10' can be inserted into the housing 100. Accordingly, the PIU 10' can be forcibly inserted into the housing 100.

Figure 15A:
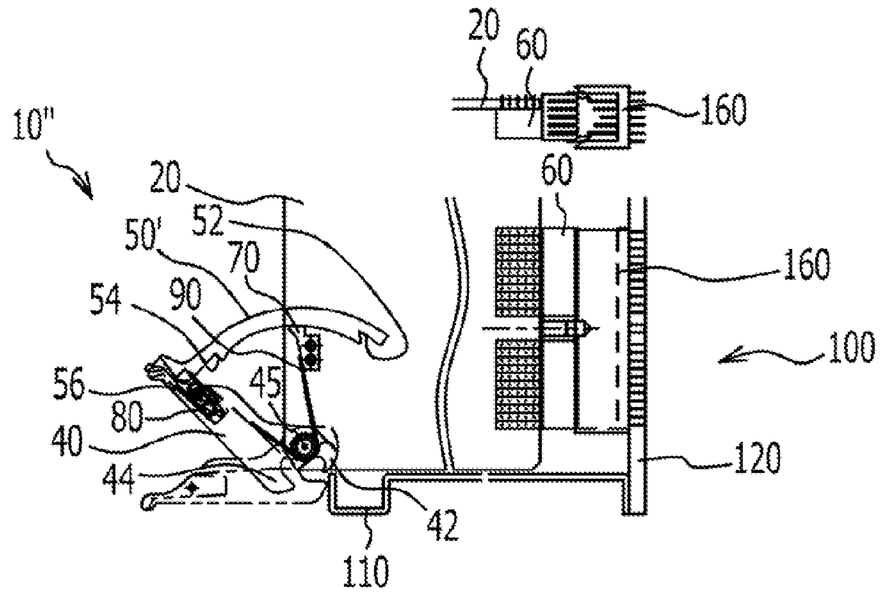
FIG. 15A is a diagram explaining an electronic apparatus according to a third embodiment.

FIG. 15A is a diagram explaining the electronic apparatus according to the third embodiment. As illustrated in FIG. 15A, the lever 40 is provided with an urging member 90 that urges the lever 40 such that the lever is in the first position. One end of the urging member 90 presses against the lever 40 and the other end thereof presses against the regulating portion 70. The urging member 90 is wound around the shaft 45. Since the urging member 90 urges the lever 40 such that the lever is in the first position as described above, the engaging portion 52 of the lock lever 50' is assisted to engage with the regulating portion 70. In other words, the urging member 90 assists the lever 40 in being locked in the first position. Since the lever 40 is locked in the first position, a PIU 10" is prevented from being forcibly inserted into the housing 100.

Figure 15B:
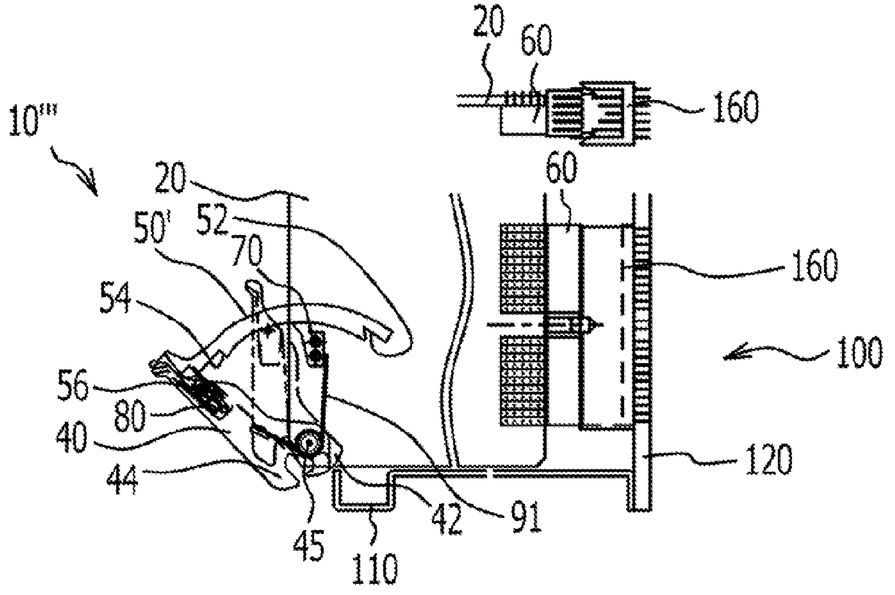
FIG. 15B is a diagram explaining an electronic apparatus according to a modification of the third embodiment.

FIG. 15B is a diagram explaining an electronic apparatus according to a modification of the third embodiment. As illustrated in FIG. 15B, the lever 40 is provided with an urging member 91 that urges the lever 40 such that the lever is in the second position. One end of the urging member 91 engages with the lever 40 and the other end thereof engages with the regulating portion 70. The urging member 91 is wound around the shaft 45. As described above, the urging member 91 urges the lever 40 such that the lever is in the second position. While the lever 40 is in the second position, a PIU 10''' is prevented from being inserted into the housing 100. Furthermore, since the urging member 91 urges the lever 40 such that the lever is in the second position, the lever 40 can be easily moved from the first position to the second position. This improves ease of operation upon insertion of the PIU 10''' into the housing 100.

Fourth Embodiment

Figure 16:
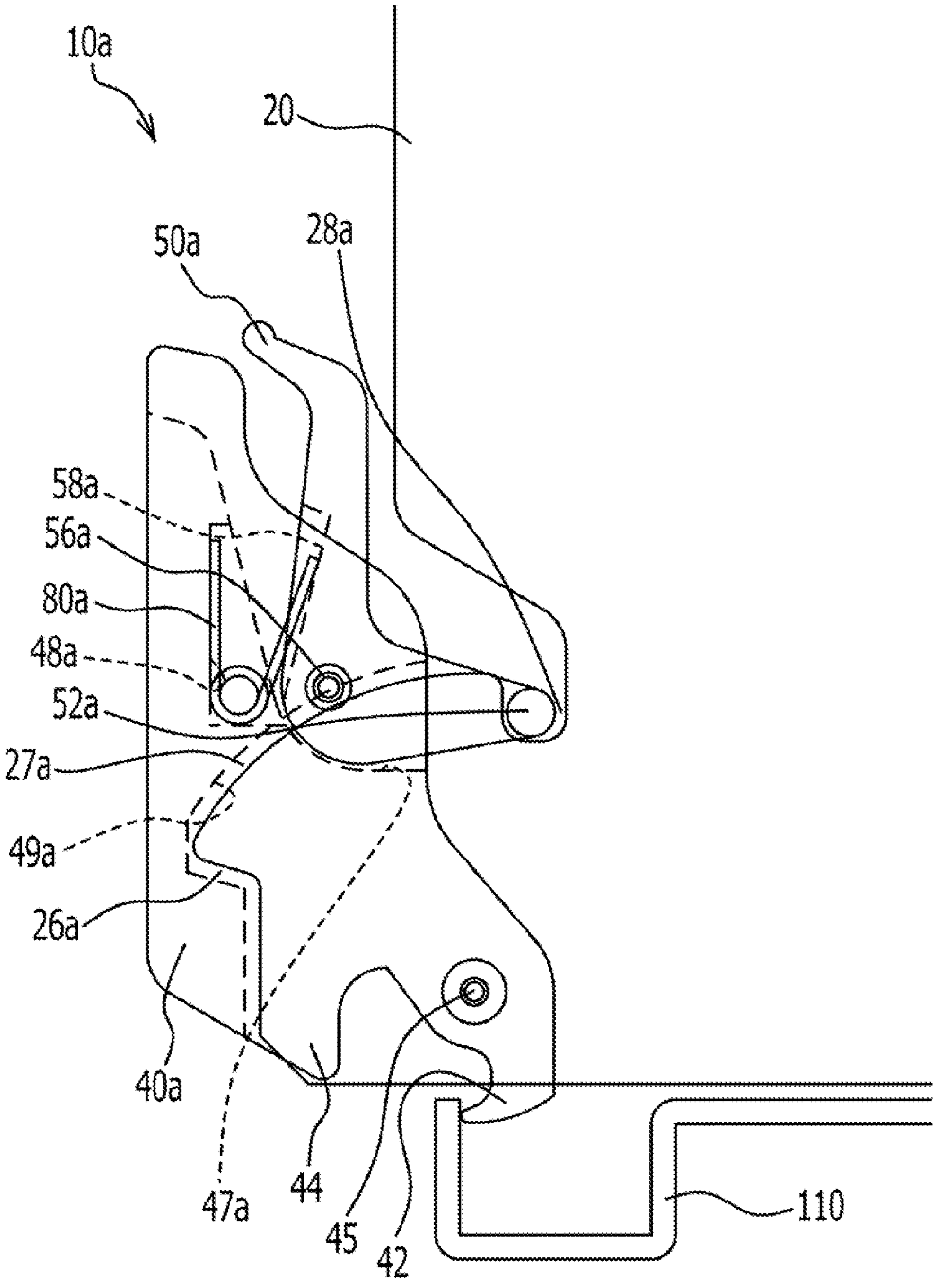
FIG. 16 is an enlarged view of part of a PIU included in an electronic apparatus according to a fourth embodiment.
Figure 17:
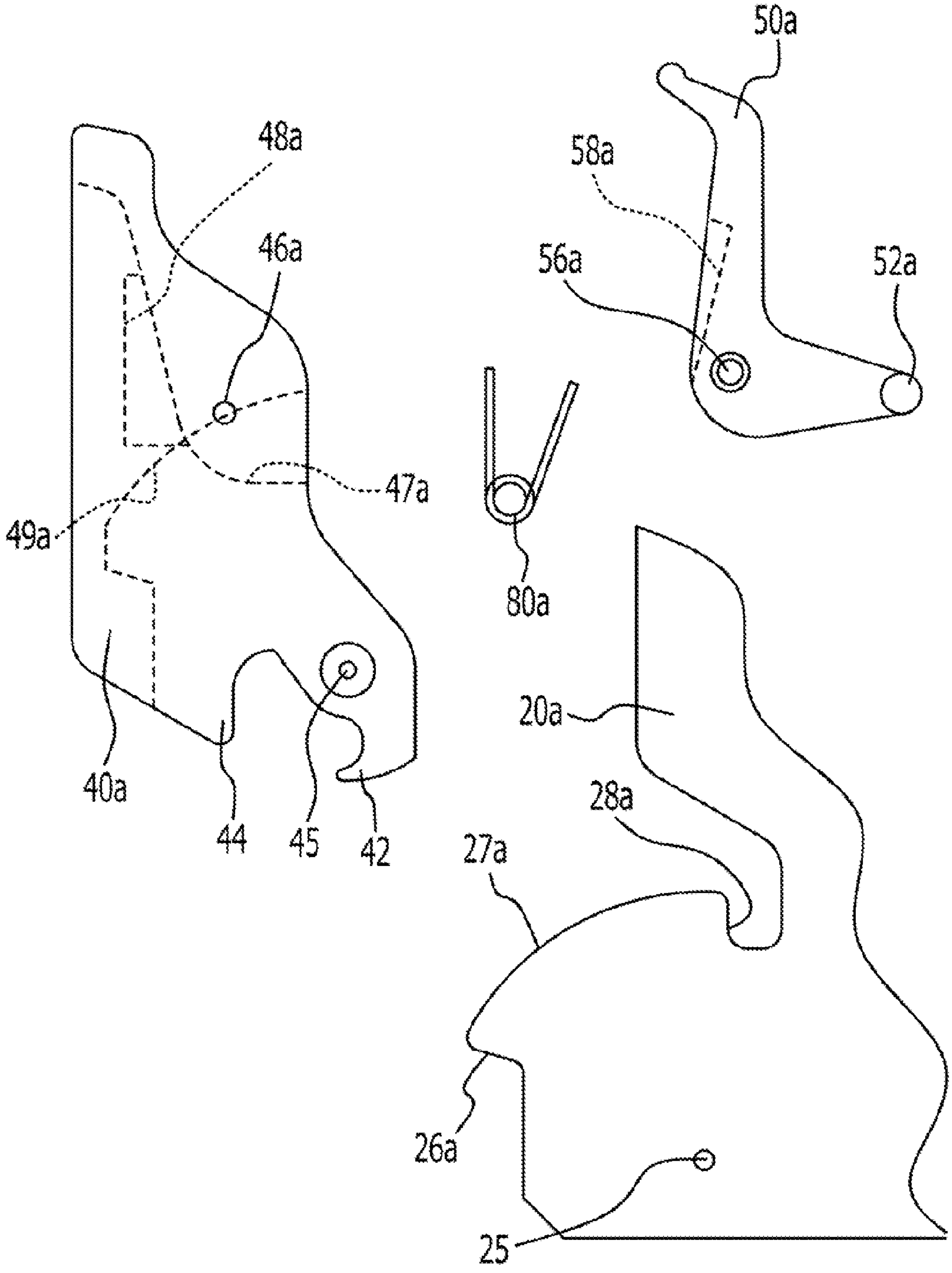
FIG. 17 is a diagram illustrating parts of the PIU included in the electronic apparatus according to the fourth embodiment.

FIG. 16 is an enlarged view of part of a PIU 10*a* included in an electronic apparatus according to a fourth embodiment. FIG. 17 illustrates parts of the PIU 10*a* included in the electronic apparatus according to the fourth embodiment. A lever 40*a* is coupled to a lock lever 50*a*. Specifically, the lock lever 50*a* has an opening 56*a* and the lever 40*a* includes a shaft 46*a* rotatably fitted in the opening 56*a*. The lock lever 50*a* includes an engaging portion 52*a* in one end thereof. The engaging portion 52*a* is pin-shaped. A printed circuit board 20*a* includes a regulating portion 26*a* which protrudes when viewed from the side, a pressure receiving portion 27*a* which is continuous with the regulating portion 26*a* and is curved when viewed from the side, and an engagement receiving portion 28*a* which is continuous with the pressure receiving portion 27*a* and is recessed when viewed from the side. The lever 40*a* has a clearance 49*a* in order to avoid interference with the regulating portion 26*a* and the pressure receiving portion 27*a* while the lever 40*a* is in the second position. An urging member 80*a* is received in a recess 48*a* of the lever 40*a* and in a recess 58*a* of the lock lever 50*a*. One end of the urging member 80*a* presses against the lever 40*a* and the other end thereof presses against the lock lever 50*a*. In FIG. 16, the urging member 80*a* urges the lock lever 50*a* clockwise relative to the lever 40*a*. The lever 40*a* includes a regulating portion 47*a* which is shaped so as to fit the outer shape of the lock lever 50*a* and regulates a rotation range of the lock lever 50*a*.

Figure 18A:
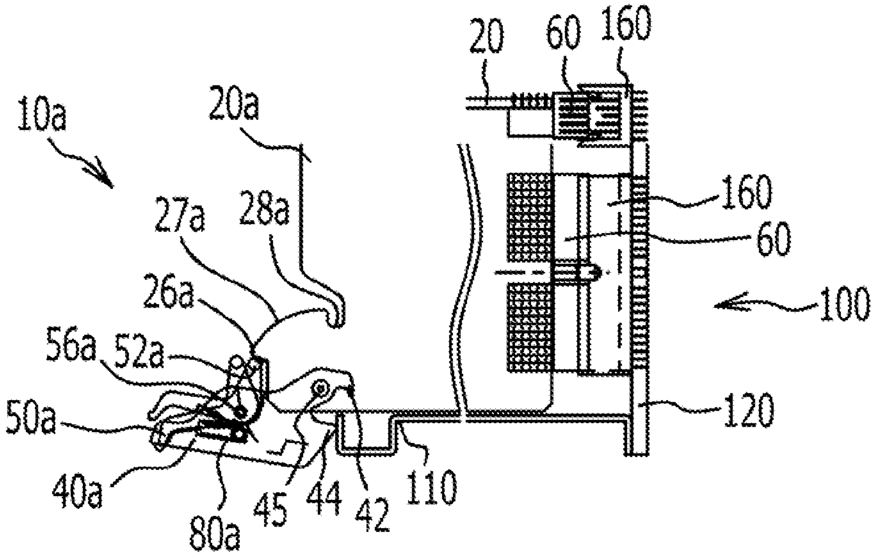
FIGS. 18A to 18D are diagrams explaining a procedure for inserting the PIU into the housing in the electronic apparatus according to the fourth embodiment.
Figure 18B:
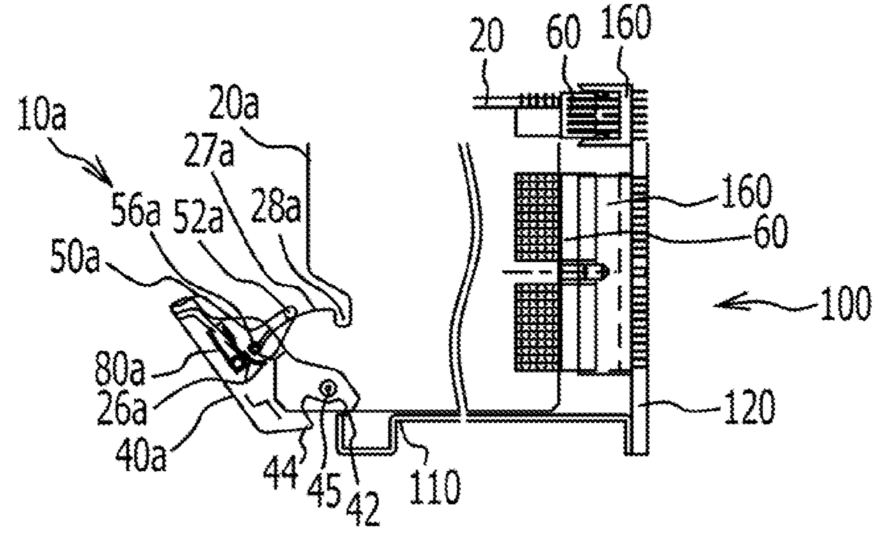
Figure 18C:
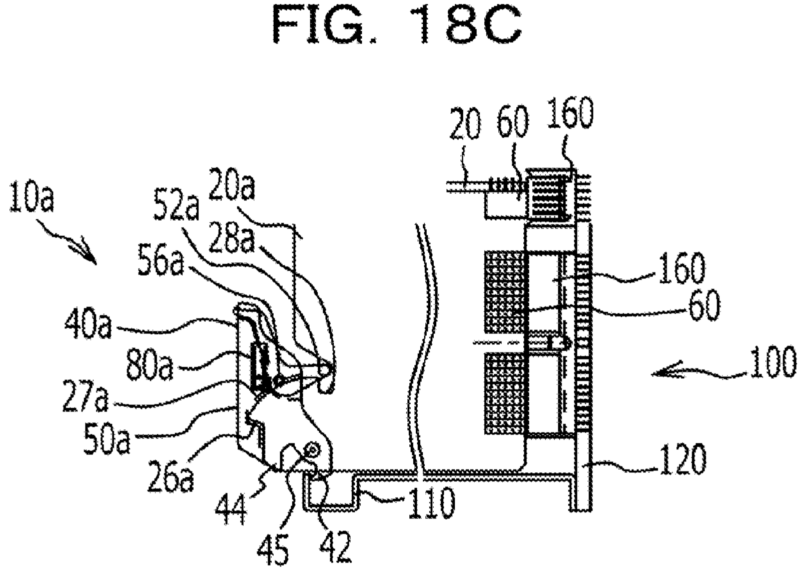
Figure 18D:
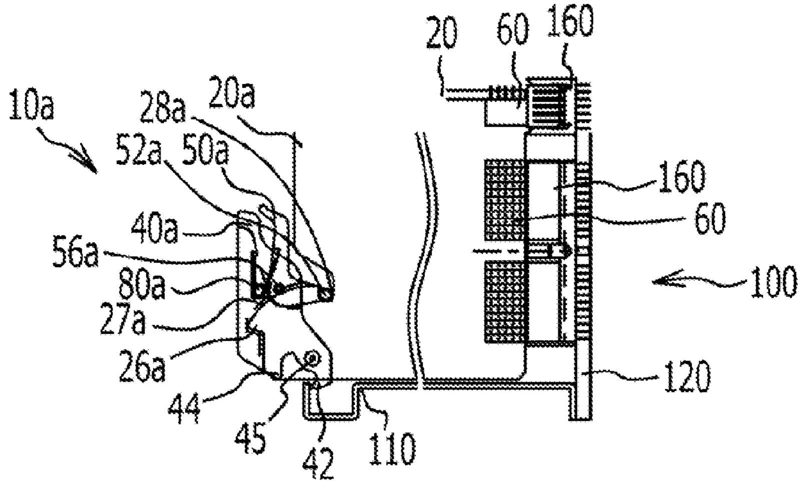

A procedure for inserting the PIU 10*a* into the housing 100 in this embodiment will now be described. FIGS. 18A to 18D are diagrams explaining the procedure for inserting the PIU 10*a* into the housing 100 in the electronic apparatus according to the fourth embodiment. Referring to FIG. 18A, the engaging portion 52*a* of the lever 40*a* in the first position engages with the regulating portion 26*a*. Thus, the lever 40*a* is prevented from moving from the first position to the second position. The operator rotates the lock lever 50*a* against an urging force of the urging member 80*a* such that the engaging portion 52*a* disengages from the regulating portion 26*a*. Consequently, the locked lever 40*a* is unlocked. Subsequently, the operator moves the lever 40*a* from the first position to the second position such that the engaging portion 52*a* moves along the pressure receiving portion 27*a* as illustrated in FIG. 18B. Accordingly, the urging force of the urging member 80*a* allows the engaging portion 52*a* to press against the pressure receiving portion 27*a*. When the engaging portion 52*a* separates from the pressure receiving portion 27*a* as illustrated in FIG. 18C, the urging force of the urging member 80*a* allows the engaging portion 52*a* to engage with the engagement receiving portion 28*a* as illustrated in FIG. 18D. Thus, the lever 40*a* is locked in the second position.

As described above, the engaging portion 52*a* of the lock lever 50*a* engages with the regulating portion 26*a* of the printed circuit board 20*a*, so that the lever 40*a* is locked in the first position. This prevents the PIU 10*a* from being forcibly inserted into the housing 100. In addition, the engaging portion 52*a* of the lock lever 50*a* engages with the engagement receiving portion 28*a* of the printed circuit board 20*a*, so that the lever 40*a* is locked in the second position. This prevents the lever 40*a* from being accidentally operated while the PIU 10*a* is properly fitted in the housing 100. Furthermore, this prevents the PIU 10*a* from being removed from the housing 100 by vibration.

Fifth Embodiment

Figure 19A:
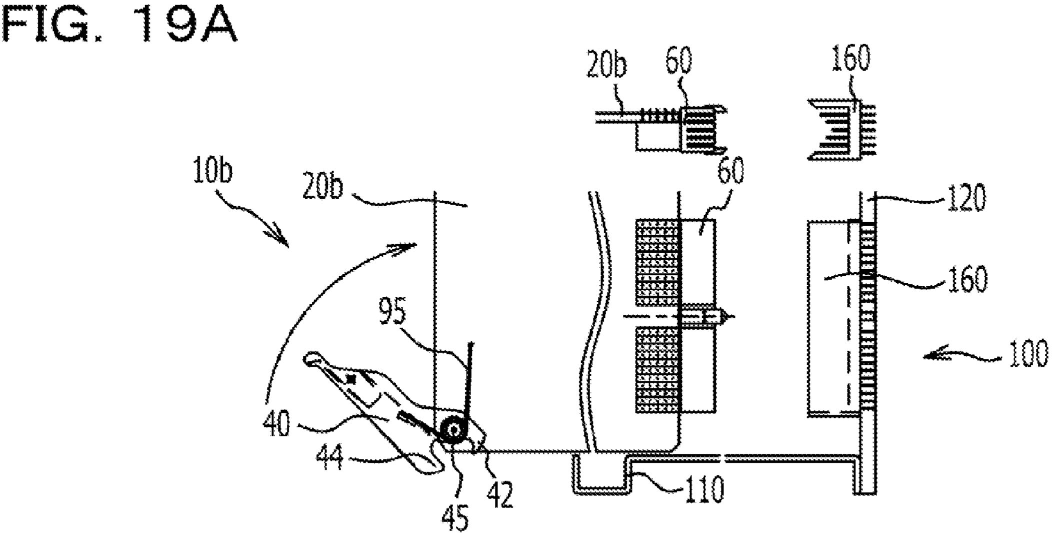
FIGS. 19A to 19C are diagrams explaining a procedure for inserting a PIU into the housing in an electronic apparatus according to a fifth embodiment.
Figure 19B:
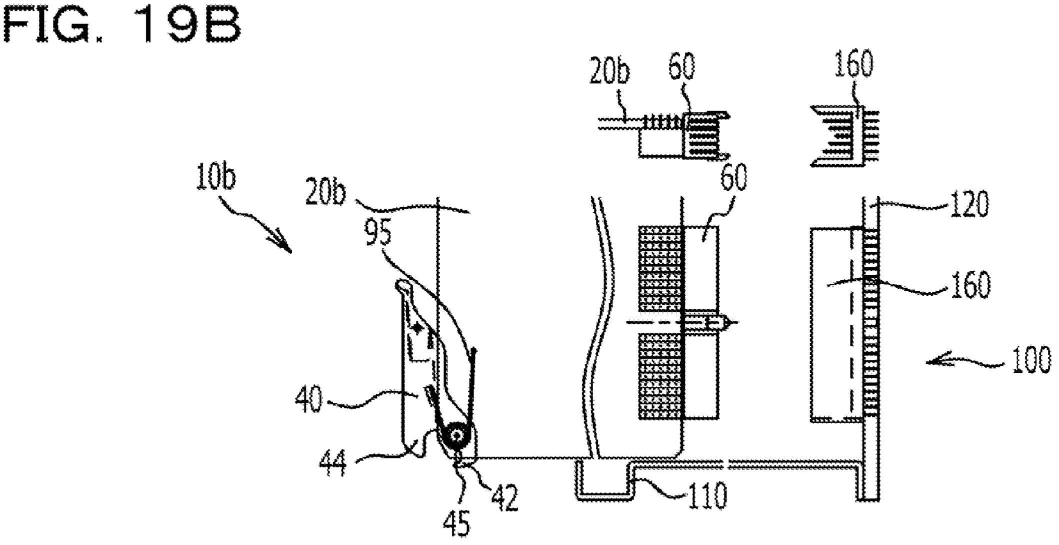
Figure 19C:
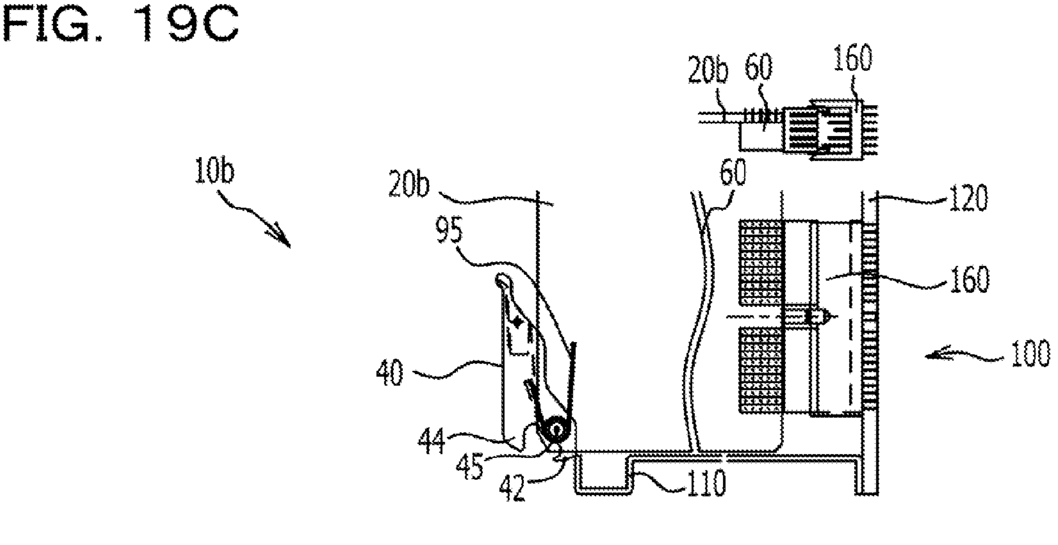

An electronic apparatus according to a fifth embodiment will be described. FIGS. 19A to 19C are diagrams explaining a procedure for inserting a PIU 10*b* into the housing 100 in the electronic apparatus according to the fifth embodiment. The PIU 10*b* does not include a lock lever like the above-described lock levers but includes an urging member 95 that urges the lever 40 such that the lever is in the second position. One end of the urging member 95 engages with the lever 40 and the other end thereof engages with a printed circuit board 20*b*. For example, the other end of the urging member 95 is fitted in an opening in the printed circuit board 20*b*. If the lever 40 is tilted as illustrated in FIG. 19A, the lever 40 is positioned in the second position by an urging force of the urging member 95 as illustrated in FIG. 19B. If the printed circuit board 20*b* is inserted into the housing 100 while the lever 40 is in the second position, the pawl 42 of the lever 40 comes into contact with the frame 110 as illustrated in FIG. 19C, so that the printed circuit board 20*b* is prevented from being inserted into the housing 100. The operator, therefore, has to move the lever 40 to the first position against the urging force of the urging member 95 and then insert the PIU 10*b* into the housing 100. Thus, the PIU 10*b* is prevented from being forcibly inserted into the housing 100.

Furthermore, to move the lever 40 from the second position to the first position, the operator has to rotate the lever 40 against the urging force of the urging member 95. Accordingly, the lever 40 is prevented from being moved to the first position by accidental operation while the PIU 10*b* is properly fitted in the housing 100. In addition, the PIU 10*b* is prevented from being removed from the housing 100 by vibration.

Although the preferred embodiments of the present invention have been described in detail, it should be understood that the present invention be not limited to the specific embodiments and various changes and modifications could be made without departing from the spirit and scope of the invention as defined in the appended claims.

As regards the above-described levers, it is not always necessary to provide two levers for each PIU. A single lever may be provided for each PIU.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic apparatus comprising:

a housing including a first connector; and a printed circuit board unit including a printed circuit board comprising a first recessed portion, a second recessed portion, and a curved surface between the first recessed portion and the second recessed portion, a second connector that is connected to the first connector at the completion of insertion of the printed circuit board into the housing, a lever that is rotatably coupled to the printed circuit board, the lever includes a lock lever movably coupled to the lever and locks the lever in a first predetermined position when the lock lever engages the first recessed portion and locks the lever in a second predetermined position when the lock lever engages the second recessed portion, and an urging member that urges the lock lever such that the lock lever engages separately with each of the first recessed portion, the curved surface, and the second recessed portion during the insertion of the printed circuit board into the housing.

2. The apparatus according to claim 1, wherein when the printed circuit board is inserted into the housing, the lever, in the first predetermined position, comes into contact with the housing, when the printed circuit board is further inserted into the housing, the lever rotates in one direction while being in contact with the housing, and when the insertion of the printed circuit board into the housing is completed, the lever is in the second predetermined position.

* * * * *